United States Patent [19]
Kuo

[11] Patent Number: 5,989,975
[45] Date of Patent: Nov. 23, 1999

[54] METHOD FOR MANUFACTURING SHALLOW TRENCH ISOLATION

[75] Inventor: Chien-Li Kuo, Hsinchu Hsien, Taiwan

[73] Assignee: United Microelectronics Corp., Hsin-Chu, Taiwan

[21] Appl. No.: 08/993,501

[22] Filed: Dec. 18, 1997

[30] Foreign Application Priority Data

Oct. 4, 1997 [TW] Taiwan ................................ 86114503

[51] Int. Cl.$^6$ .................................................. H01L 21/76
[52] U.S. Cl. ........................... 438/424; 438/435; 438/437
[58] Field of Search ..................................... 438/424, 437, 438/435, FOR 227

[56] References Cited

U.S. PATENT DOCUMENTS

| | | |
|---|---|---|
| 4,666,556 | 5/1987 | Fulton et al. . |
| 5,231,046 | 7/1993 | Tasaka . |
| 5,674,775 | 10/1997 | Ho et al. . |
| 5,763,315 | 6/1998 | Benedict et al. . |
| 5,780,346 | 7/1998 | Arghavani et al. . |

FOREIGN PATENT DOCUMENTS 303942  10/1992  Japan .

OTHER PUBLICATIONS

Wolf, S and Tauber, R.N., Silicon Processing for the VLSI Era, Lattice Press, vol. 1, p. 534, 1986.
Wolf, S and Tauber, R.N., Silicon Processing for the VLSI Era, Lattice Press, vol. 2, p. 49, 1990.

*Primary Examiner*—John F. Niebling
*Assistant Examiner*—Josetta Jones

[57] ABSTRACT

A method for manufacturing shallow trench isolation comprising the steps of providing a substrate, then forming a pad oxide layer over a substrate using a thermal oxidation process. After that, a silicon nitride layer is formed over the pad oxide layer using a low pressure chemical vapor deposition method. Next, using conventional photolithographic and etching processes, the silicon nitride layer is patterned to form an opening exposing the pad oxide layer. In a subsequent step, the pad oxide layer exposed by the opening and the substrate below the opening is etched to form a deep trench. Thereafter, portions of the silicon nitride layer and the pad oxide layer are etched away using hot phosphoric acid solution to expose portions of the substrate. Finally, a liner oxide layer is formed over the interior surface of the trench. The characteristic of this invention includes the formation of a smooth upper trench corners and a liner oxide layer thicker than the pad oxide layer. Therefore, the problem of current leaking from devices due to subthreshold kink effect can be avoided.

15 Claims, 4 Drawing Sheets

METHOD FOR MANUFACTURING SHALLOW TRENCH ISOLATION

BACKGROUND OF THE INVENTION

1. Field of Invention

The present invention relates to a method for manufacturing semiconductor devices. More particularly, the present invention relates to a method for manufacturing shallow trench isolation (STI).

2. Description of Related Art

A complete integrated circuit is generally made from tens of thousands of transistors. To prevent the short-circuiting of any two neighboring transistors, an insulating layer is normally formed between the transistors for isolating the devices. For example, shallow trench isolation is formed by etching a trench in the substrate and then filling the trench with an insulating material to define an active device area.

FIGS. 1A through 1C are cross-sections showing the progression of manufacturing steps in the production of conventional shallow trench isolation. First, as shown in FIG. 1A, a substrate 10 is provided. Then, a pad oxide layer 11 is formed over the substrate 10 using a thermal oxidation process. The pad oxide layer can be, for example, a silicon dioxide layer. Thereafter, a silicon nitride layer 12 ($Si_3N_4$) is formed over the pad oxide layer 11 using a low pressure chemical vapor deposition (LPCVD) method.

Next, as shown in FIG. 1B, a photoresist layer 13 is formed over the silicon nitride layer 12, and then a photolithographic process is used to form a pattern on the silicon nitride layer 12. Then, the silicon nitride layer 12 is anisotropically etched to exposed portions of the pad oxide layer using a dry etching method. Similarly, using a photoresist layer 13 and photolithographic processing again, a pattern is formed on the pad oxide layer 11 and the substrate 10. Then, the exposed pad oxide layer 11 is anisotropically etched using a dry etching method. Etching continues down into the substrate 10, and finally forming a trench 14 having interior surfaces 15 that exposes portions of the substrate 10.

Next, as shown in FIG. 1C, the photoresist layer 13 is removed to expose the silicon nitride layer 12.

FIG. 2 is a magnified view showing the features at the corner within the dash circle of FIG. 1C. As shown in FIG. 2, the exposed substrate surface at the upper corner of the trench 14 is rather small. Furthermore, subsequently formed liner oxide layer will have a rather steep gradient along the trench corner location.

Thereafter, a liner oxide layer is formed at a high temperature using a thermal oxidation process. The liner oxide layer covers the interior surfaces 15 of the trench 14, and has contact with the pad oxide layer 11 at the upper corner of the trench 14.

Finally, conventional processes are performed to complete the structural formation of shallow trench isolation. For example, the trench 14 is filled using an insulating material such as silicon dioxide. Other subsequent processes are known to those skill in the art, therefore detail description is omitted here.

In the conventional method, the exposed substrate area at the upper trench corners is very small. Moreover, one side of the upper corner is the substrate, while the other side is the pad oxide layer. Therefore, the subsequently formed gate oxide layer will be thinner, thereby leading to a lowering of its reliability. Another consequence of a thin gate oxide layer is that there is an increase in the electric field strength at the upper corner locations. Furthermore, the upper corner fabricated by a conventional method is not too smooth either.

Moreover, due to the over-exposure of the substrate at the upper corner of the trench in a subsequent pad oxide layer removing process, kink effect is easily produced at the upper corner locations. Hence, sub-threshold current will be generated in the device, thereby leading to a current leakage problem.

In light of the foregoing, there is a need in the art to improve the method for manufacturing shallow trench isolation.

SUMMARY OF THE INVENTION

Accordingly, the present invention is directed to provide a method for manufacturing shallow trench isolation that exposes more substrate at the upper trench corners such that a smoother upper trench corners and a thicker liner oxide layer can be obtained through subsequent processes. This serves to minimize the kink effect in a conventional technique, and reduces current leakage problem caused by subthreshold current in the device. Hence, the overall efficiency of the device is improved.

To achieve these and other advantages and in accordance with the purpose of the invention, as embodied and broadly described herein, the invention provides a method for manufacturing shallow trench isolation. The method comprises the steps of providing a substrate, then forming a pad oxide layer over a substrate using a thermal oxidation process. After that, a silicon nitride layer is formed over the pad oxide layer using a low pressure chemical vapor deposition method. Next, using conventional photolithographic and etching processes, the silicon nitride layer is patterned to form an opening exposing the pad oxide layer. In a subsequent step, the pad oxide layer exposed by the opening is etched away. Then, the etching continues down the substrate through the opening forming a deep trench having interior surfaces. Thereafter, portions of the silicon nitride layer and the pad oxide layer are etched away to expose portions of the substrate. Finally, a liner oxide layer is formed over the interior surface of the trench.

The method of removing portions of the silicon nitride layer and the pad oxide layer includes using an isotropic wet etching method, for example, using hot phosphoric acid solution as an etchant. Through the above etching process, more of the substrate at the upper trench corner locations can be exposed. Moreover, when the liner oxide layer is subsequently grown over the interior surface of the trench, the upper trench corner locations will be more smoothly covered. Furthermore, the liner oxide layer can have a thickness greater than the pad oxide layer. This serves to prevent the over-exposure of the substrate at the upper corners when the pad oxide layer is subsequently removed. Hence, current leakage problem of devices can be avoided.

Therefore, the first characteristic of this invention is the use of hot phosphoric acid wet etching method to remove portions of the silicon nitride layer and the pad oxide layer so that more substrate surface is exposed at the upper trench corner locations. Hence, smoother upper trench corners are obtained.

The second characteristic of this invention is that thickness of the liner oxide layer at the upper trench corner locations produced by this method is greater than the pad oxide layer. Consequently, when the pad oxide layer is removed in a subsequent process, over-exposure of the substrate at the upper corners is prevented. Hence, current leakage problem can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
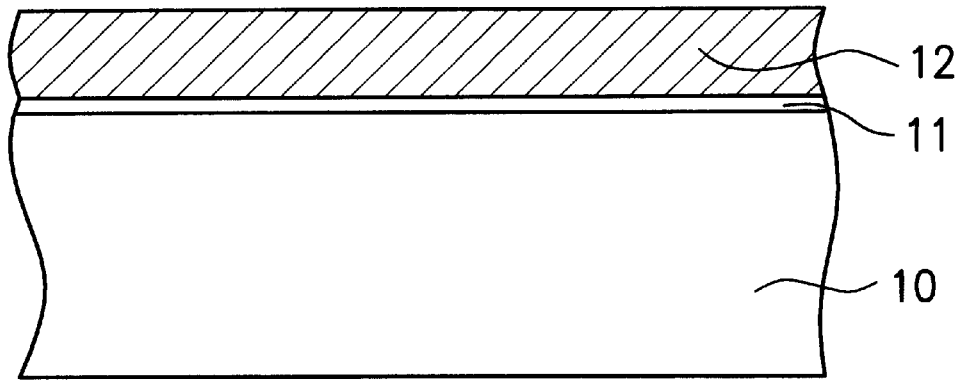
FIGS. 1A through 1C are cross-sections showing the progression of manufacturing steps in the production of conventional shallow trench isolation.
Figure 1B:
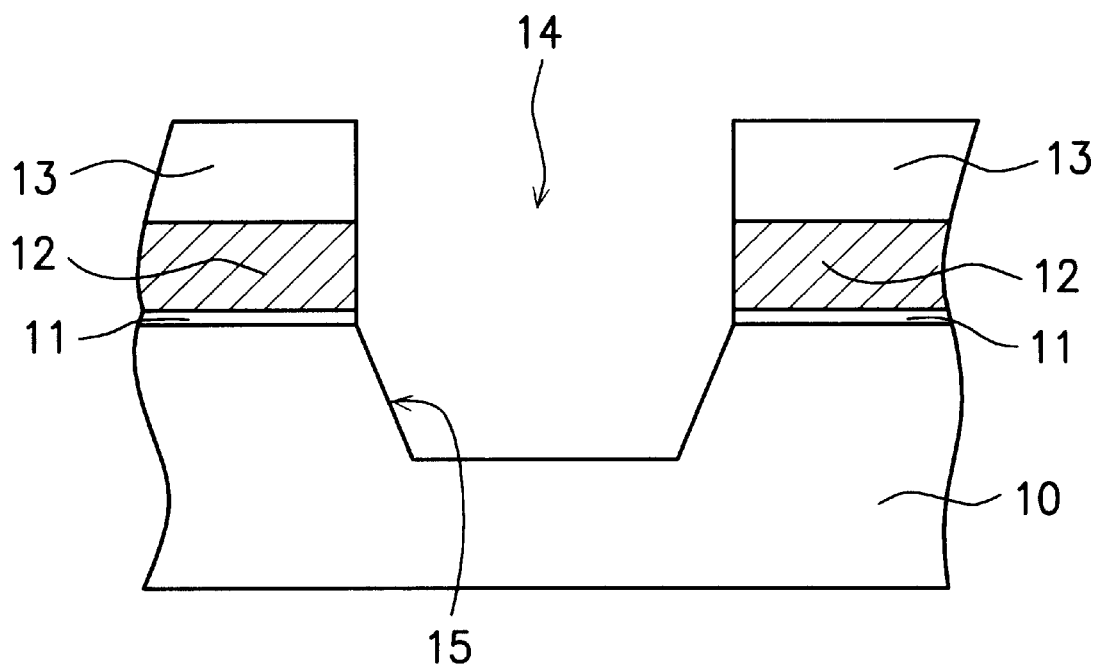
Figure 1C:
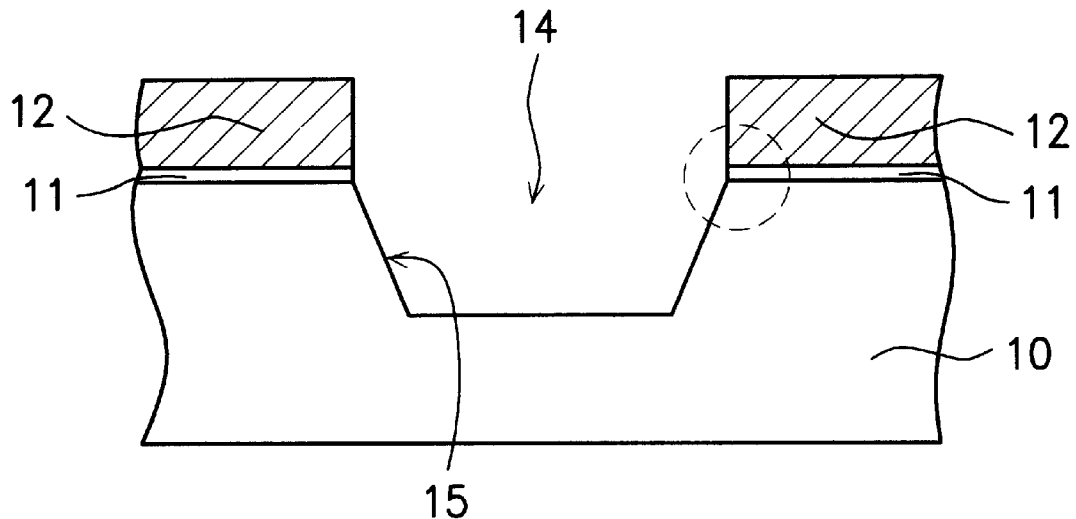
Figure 2:
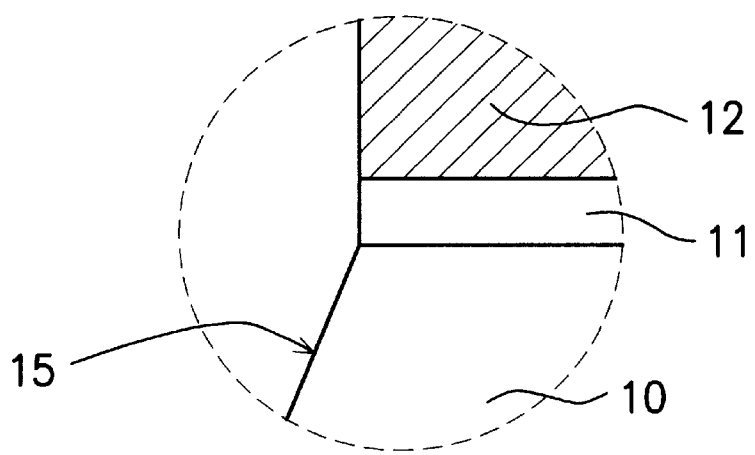
FIG. 2 is a magnified view showing the features at the corner within the dash circle of FIG. 1C.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
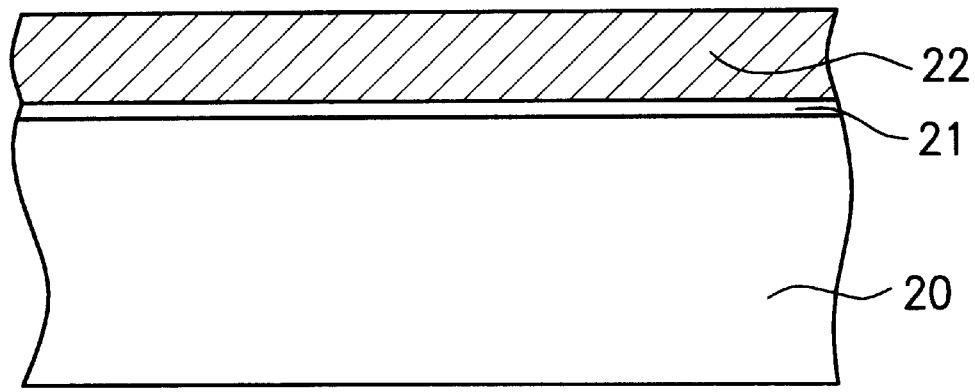
FIGS. 3A through 3D are cross-sections showing the progression of manufacturing steps in the production of shallow trench isolation according to one preferred embodiment of this invention.

FIGS. 3A through 3D are cross-sections showing the progression of manufacturing steps in the production of shallow trench isolation according to one preferred embodiment of this invention. First, as shown in FIG. 3A, a substrate 20 is provided. Then, a pad oxide layer 21 is formed over the substrate 20, for example, using a thermal oxidation process. The pad oxide layer 21 is preferably a silicon dioxide layer. Thereafter, a silicon nitride layer 22 is formed over the pad oxide layer 21 using a low-pressure chemical vapor deposition method.

Figure 3B:
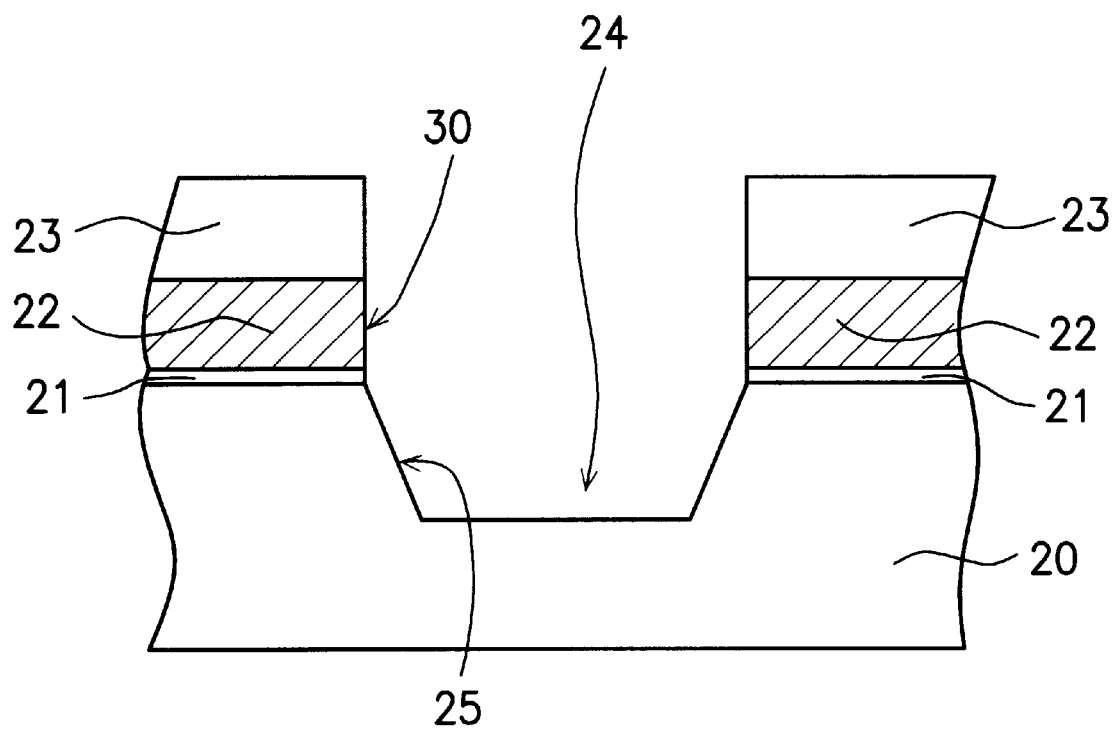

Next, as shown in FIG. 3B, a photoresist layer 23 is formed over the silicon nitride layer 22. Then, the silicon nitride layer 22 is patterned to form an opening 30 exposing the pad oxide layer 21. Patterning is carried out using conventional photolithographic and etching processes, wherein the etching includes using an anisotropic dry etching method. Thereafter, using an anisotropic dry etching method, the pad oxide layer 21 inside the opening 30 is etched away. Then, the etching is continued down into the substrate 20 forming a trench 24 having an interior surface 25.

Figure 3C:
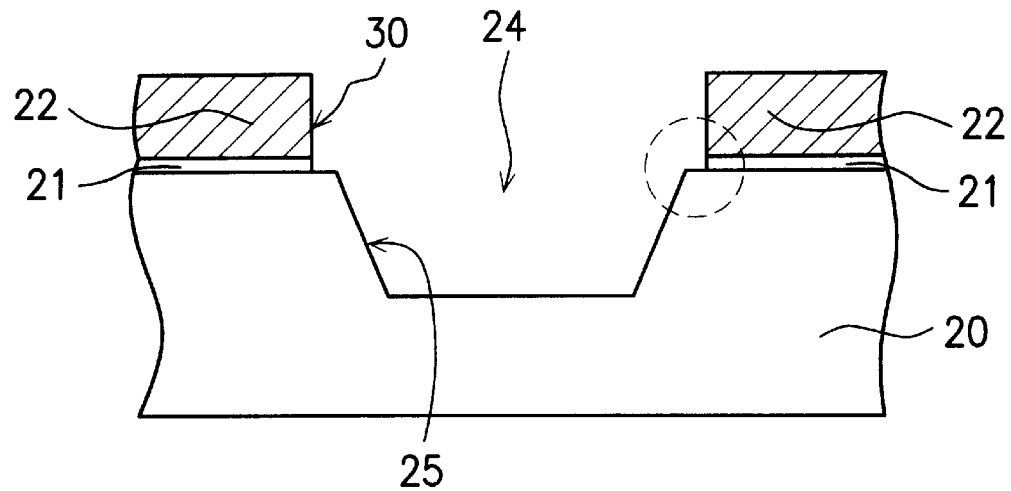

Next, as shown in FIG. 3C, the photoresist layer 23 is removed to expose the silicon nitride layer 22. In a subsequent step, portions of the silicon nitride layer 22 and the pad oxide layer 21 are removed using an isotropic wet etching method such that the opening 30 in the silicon nitride layer is wider than the upper portion of the trench 24 opening. The wet etching method includes using hot phosphoric acid solution, for example.

Figure 4:
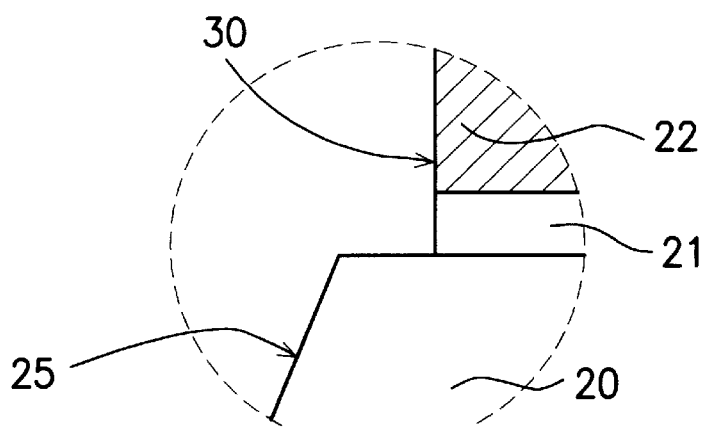
FIG. 4 is a magnified view showing the features at the corner within the dash circle of FIG. 3C.

FIG. 4 is a magnified view showing the features at the corner within the dash circle of FIG. 3C. As shown in FIG. 4, because the opening 30 in the silicon nitride layer 22 is wider than the upper portion of the trench 24 opening, more substrate 20 surface is exposed. Hence, smoother upper corner can be obtained by this method. In addition, thickness of the liner oxide layer at the upper corner locations formed in a subsequent process can be made greater than the thickness of the pad oxide layer. Therefore, over-exposure of the substrate at the upper corner locations during subsequent removal of the pad oxide layer 21 can be prevented, thereby avoiding the problem of current leaking from devices.

Figure 3D:
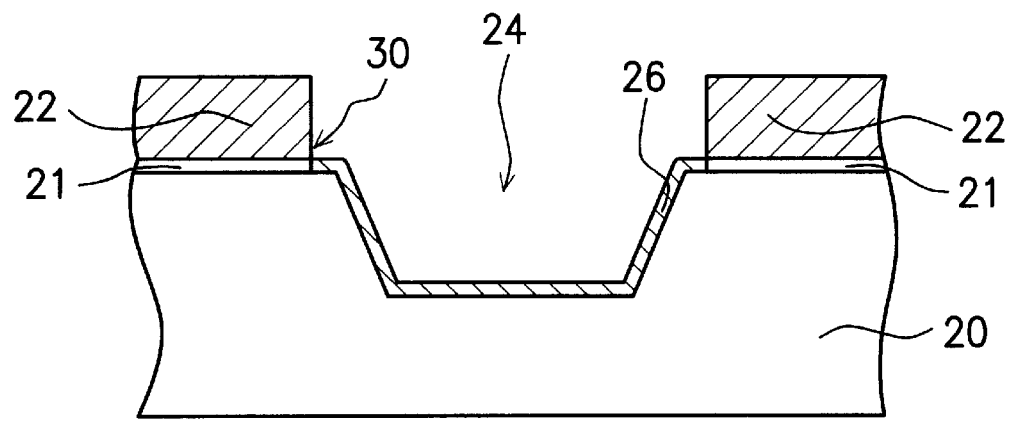

Next, as shown in FIG. 3D, a liner oxide layer 26 is formed over the substrate 20 and the interior surface 25 of the trench 24 using a high temperature oxidation method. The liner oxide layer 26 is in contact with the pad oxide layer 21, made from silicon dioxide, and preferably has a thickness of about 200 Å to 600 Å.

Finally, conventional processes are performed to complete the structural formation of shallow trench isolation. For example, the trench 24 is filled by an insulating material such as silicon dioxide. Other subsequent processes are known to those skill in the art, therefore detail description is omitted here.

The first characteristic of this invention is the use of hot phosphoric acid wet etching method to remove portions of the silicon nitride layer and the pad oxide layer so that more substrate surface is exposed at the upper trench corner locations. Hence, smoother upper trench corners are obtained.

The second characteristic of this invention is that the thickness of the liner oxide layer at the upper trench corner locations produced by this method is greater than the pad oxide layer. Consequently, when the pad oxide layer is removed in a subsequent process, over-exposure of the substrate at the upper corners is prevented. Hence, the problem of current leaking from devices can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing shallow trench isolation, comprising the steps of:
   providing a substrate;
   forming a pad oxide layer over the substrate;
   forming a silicon nitride layer over the pad oxide layer, and including the further sequential steps of:
   patterning the silicon nitride layer to form an opening exposing portions of the pad oxide layer;
   etching the pad oxide layer and the substrate down the opening to form a trench into the substrate;
   etching portions of the silicon nitride layer and the pad oxide layer to form an opening in the silicon nitride layer wider than the upper trench opening; and
   forming a liner oxide layer over the interior surface of the trench and the wider opening formed by the etching step.

2. The method of claim 1, wherein the step forming the pad oxide layer includes using a thermal oxidation process.

3. The method of claim 1, wherein the step of forming the silicon nitride layer includes using a low-pressure chemical vapor deposition method.

4. The method of claim 1, wherein the step of patterning the silicon nitride layer includes coating a photoresist layer over the silicon nitride layer, and then using conventional photolithographic and etching techniques to etch the silicon nitride layer to expose the pad oxide layer.

5. The method of claim 4, wherein the etching step includes using an anisotropic dry etching method.

6. The method of claim 4, wherein after the step of etching the pad oxide layer and the substrate, further includes the step of removing the photoresist layer.

7. The method of claim 5, wherein the etching step includes using hot phosphoric acid solution in a wet etching method.

8. The method of claim 1, wherein the step of etching the pad oxide layer and the substrate includes using an anisotropic dry etching method.

9. The method of claim 1, wherein the step of removing portions of the silicon nitride layer and the pad oxide layer includes using a wet etching method.

10. The method of claim 9, wherein the step of wet etching includes using hot phosphoric acid solution.

11. The method of claim 1, wherein the step of forming the liner oxide layer includes using a thermal oxidation process.

12. The method of claim 1, wherein the liner oxide layer is formed so that one end of the layer is in contact with the pad oxide layer.

13. The method of claim 1, wherein the liner oxide layer has a thickness of about 200 Å to 600 Å.

14. The method of claim 1, wherein the step of forming the liner oxide layer includes depositing a silicon dioxide layer.

15. The method of claim 1, wherein the step of forming the pad oxide layer includes depositing a silicon dioxide layer.

* * * * *